United States Patent
Smith

(10) Patent No.: US 6,971,053 B1
(45) Date of Patent: Nov. 29, 2005

(54) METHOD FOR INITIATING INTERNAL PARITY OPERATIONS IN A CAM DEVICE

(75) Inventor: Scott G. Smith, San Jose, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 330 days.

(21) Appl. No.: 10/208,226

(22) Filed: Jul. 30, 2002

(51) Int. Cl.[7] .................................. G11C 29/00
(52) U.S. Cl. ....................... 714/723; 714/722
(58) Field of Search ............... 714/766, 733, 714/30, 718, 723, 722; 365/230.03, 49

(56) References Cited

U.S. PATENT DOCUMENTS

| | | | |
|---|---|---|---|
| 4,882,731 A | 11/1989 | van Gils | 371/37.6 |
| 5,086,429 A | 2/1992 | Gray et al. | 371/9.1 |
| 5,392,301 A * | 2/1995 | Fukushima | 714/766 |
| 5,914,907 A * | 6/1999 | Kobayashi et al. | 365/230.03 |
| 5,978,947 A * | 11/1999 | Kim et al. | 714/733 |
| 6,681,359 B1 * | 1/2004 | Au et al. | 714/733 |
| 6,690,595 B1 * | 2/2004 | Srinivasan et al. | 365/49 |
| 6,691,252 B2 * | 2/2004 | Hughes et al. | 714/30 |
| 6,728,124 B1 * | 4/2004 | Ichiriu et al. | 365/49 |

* cited by examiner

*Primary Examiner*—David Ton
(74) *Attorney, Agent, or Firm*—Christopher P. Maiorana, PC

(57) ABSTRACT

A circuit and a method of operating the circuit is provided. The method generally comprises the steps of (A) receiving an explicit error checking instruction generated outside the circuit, (B) performing an error checking operation for at least one of a plurality of memory locations within the circuit, and (C) generating a result signal from the error checking operation.

18 Claims, 5 Drawing Sheets

METHOD FOR INITIATING INTERNAL PARITY OPERATIONS IN A CAM DEVICE

FIELD OF THE INVENTION

The present invention relates to a method and/or architecture for error checking generally and, more particularly, to a method for initiating internal parity operations in a content addressable memory device.

BACKGROUND OF THE INVENTION

Conventional content addressable memory (CAM) devices use two known methods of initiating and controlling parity check operations. A first method operates the CAM device at a higher internal operating rate than that of a supplied clock or control signal to allocate parity checking time. An internal parity engine performs parity operations using additional "hidden" cycles caused by the higher internal clock rate. The number of hidden cycles defines the time available for parity checking operations.

In the first method, a user loses an ability to cause the CAM device to perform parity check operations deterministically. To increase a frequency of the parity check operation selection, the user must stop critical control inputs in order to artificially create the internal hidden cycles. Furthermore, the user may not be able to control the frequency of operation selection during normal operations. The frequency of operation selection is typically hardwired as a difference between the supplied or external frequency and the internal operating frequency.

Referring to FIG. 1, a block diagram of another conventional method of operating the CAM device for parity checking is shown. In the second method, a user device 6 stops or delays normal operation of a CAM device 8 by providing an idle instruction 10 within a stream of other instructions 12a–d to a CAM core 14. An internal parity engine 16 can then use the idle instruction time to perform a parity checking operation 18. The idle instruction cycles are considered "no-op" cycles and depend upon a design of the CAM device 8. The number of idle instruction cycles also defines the time available for parity checking operations 18.

In the second method, the user device 6 must stop normal operations to allow for the idle instruction cycles. Stopping normal user operations implies an addition of control circuitry in the user device 6 that can stall the issuing of new CAM device instructions for a proper duration and at a proper frequency. The user device 6 must also tolerate the stall. In addition, the number of idle cycles must be taken into account by the user device 6 before issuing the next instruction. However, the number of idle cycles required to complete the parity check operations can change from CAM device implementation to implementation and can depend on the frequency of the parity check operations.

SUMMARY OF THE INVENTION

The present invention concerns a circuit and method of operating the circuit. The method generally comprises the steps of (A) receiving an explicit error checking instruction generated outside the circuit, (B) performing an error checking operation for at least one of a plurality of memory locations within the circuit, and (C) generating a result signal from the error checking operation.

The objects, features and advantages of the present invention include providing a method and/or architecture for initiating internal error checking operations in a circuit that may provide for (i) a mechanism that allows a user to deterministically initiate and control error checking operations, (ii) a common instruction useable in a wide range of circuit designs, (iii) the user specifying a frequency of the error checking operation, (iv) varying the frequency of error checking operations over a course of normal operations based on system application parity requirements, (v) elimination of reliance on a background process and/or (vi) synchronization of core operations with the number of received instructions.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
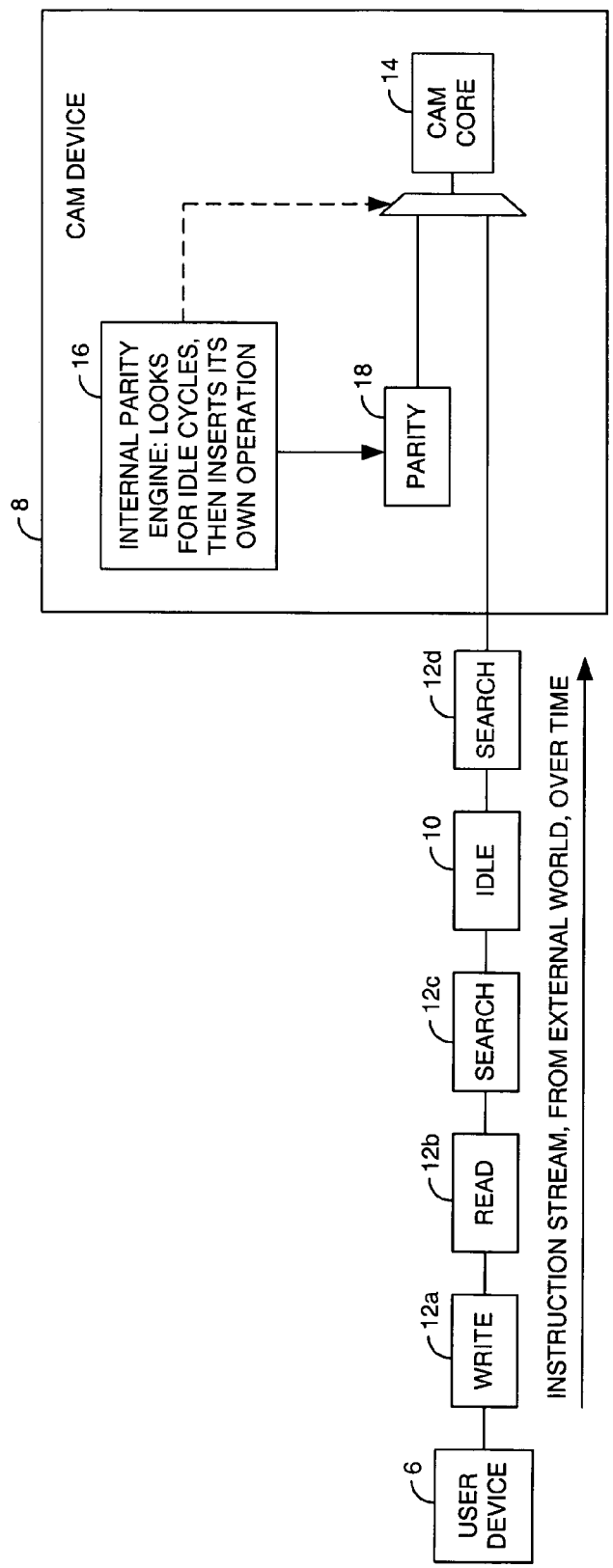
FIG. 1 is a block diagram of a conventional method of operating a content addressable memory (CAM) device.
Figure 2:
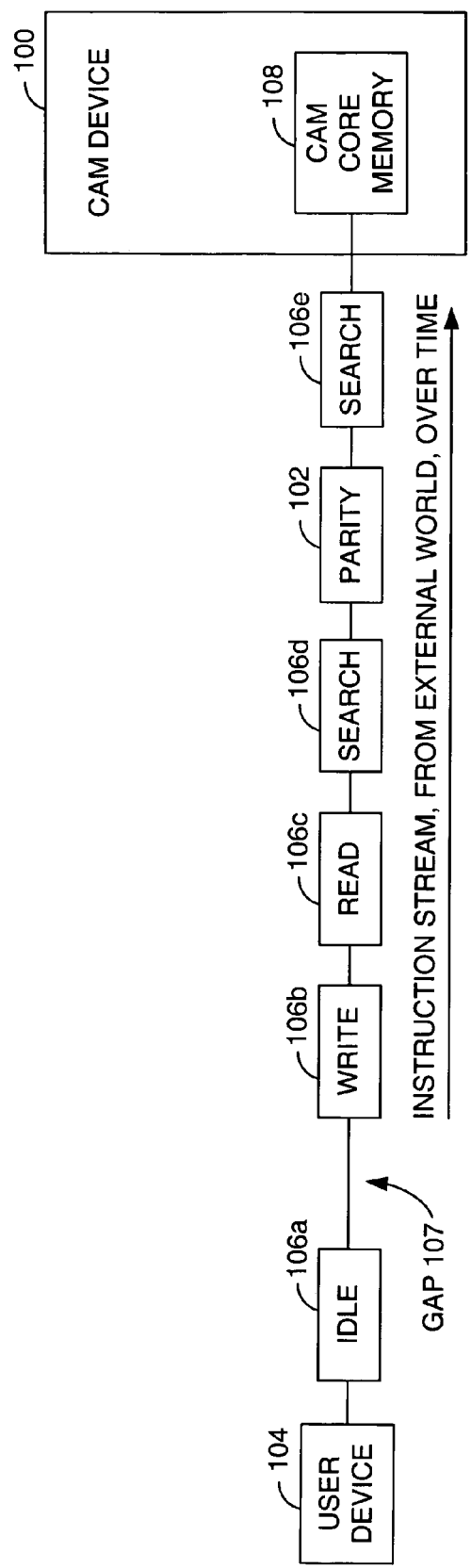
FIG. 2 is a block diagram of an example instruction stream for a CAM circuit.

Referring to FIG. 2, a block diagram of an example instruction stream for a device or circuit 100 is shown in accordance with a preferred embodiment of the present invention. The present invention generally introduces an explicit error checking instruction or parity instruction 102 into the instruction stream to initiate an error checking operation inside the circuit 100. A user device 104 may be configured to insert the parity instruction 102 into the instruction stream and continue operation without stalling.

The circuit 100 may be implemented as a content addressable memory (CAM) circuit, a memory circuit, or similar circuit that may respond to the stream of instructions and perform error checking operations. The error checking operations may be error detection operations, parity checking operations, error detection and correction operations, or the like. The instructions 106a–e may include, but are not limited to write instructions, read instructions, learn instructions, and/or search instructions. Gaps 107 may also occur between the instructions 102 and 106a–e.

The parity instruction 102 may contain a number of cycles allocated to the circuit 100 to complete an error checking operation. As such, different circuits 100 from different vendors may be programmable to complete the error checking operation at a known time. Therefore, the user device 104 may not be required to track the different number of cycles used by different circuit designs to perform the error checking operation. The user device 104 may also have deterministic control over if and when the error checking operations occur in the circuit 100 by issuing or withholding the parity instruction 102. In addition, the user device 104 may increase or decrease a frequency of the error checking operations by issuing the parity instruction 102 at a corresponding rate.

In a normal flow of operation, the user device 104 may issue CAM operations in the form of instructions to the CAM circuit 100. To initiate an error checking operation, the user device 104 may insert the parity instruction 102 into the instruction stream, treating the parity instruction 102 like all other instructions 106a–e. The rate at which the parity instructions 102 are inserted generally allows control over when and how often the error checking operations occur in the CAM circuit 100. Therefore, the user device 104 may control the amount of time required to check all entries of the entire CAM circuit 100. Each parity instruction 102 may include a starting address for the memory location(s) to be checked. Furthermore, each parity instruction 102 may identify, indicate or define how many memory locations are to be checked.

Figure 3:
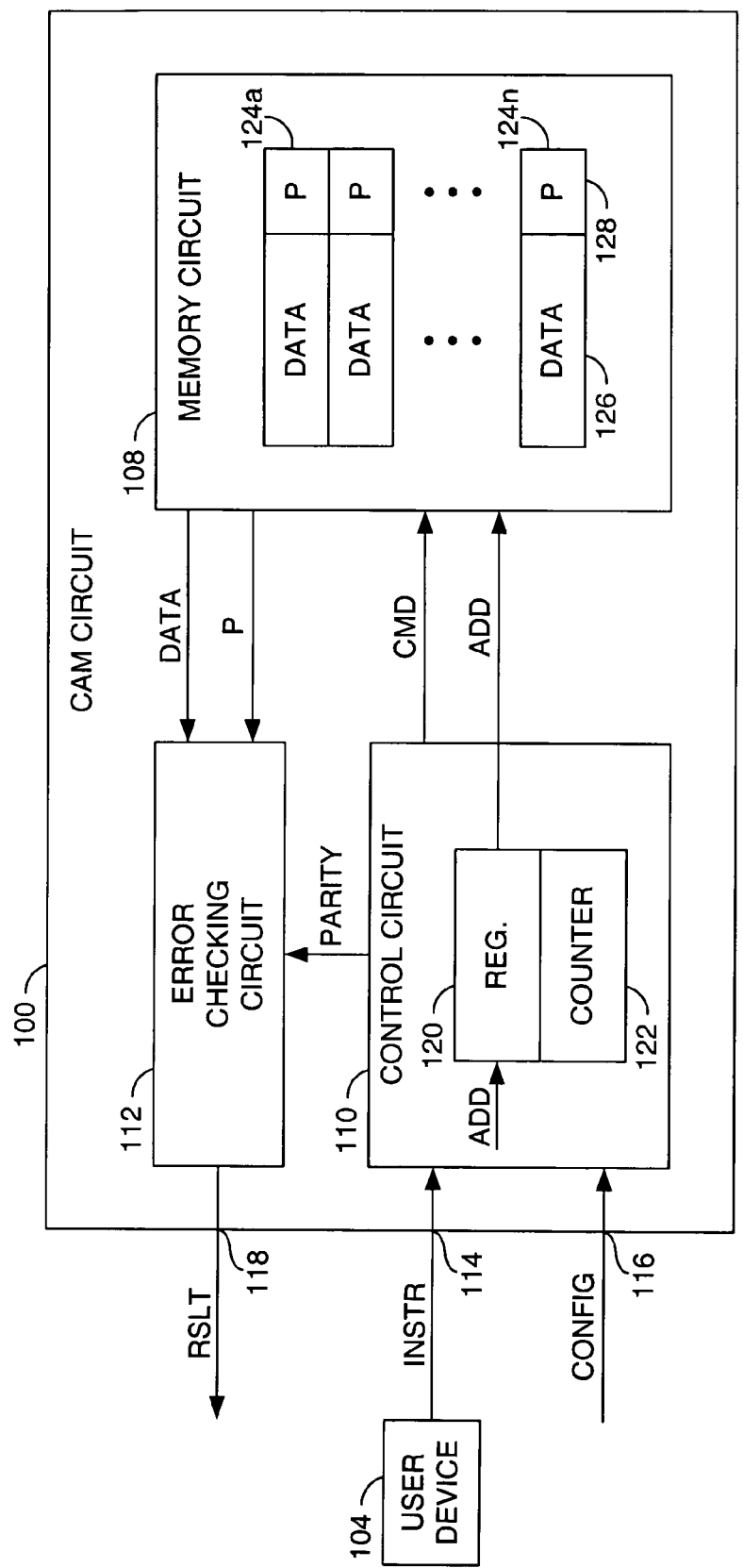
FIG. 3 is a block diagram of an example implementation of a CAM circuit.

Referring to FIG. 3, a block diagram of an example implementation of the CAM circuit 100 is shown. The CAM circuit 100 generally comprises a memory circuit 108, a control circuit 110, and an error checking engine or circuit 112. The user device 104 is generally shown to aid in explaining operations of the CAM circuit 100.

The control circuit 110 may receive a signal (e.g., INSTR) generated by the user device 104 at an interface 114. Another signal (e.g., CONFIG) may be programmed or hardwired at an interface 116 and connected to the control circuit 110. The control circuit 110 may generate and present a signal (e.g., CMD) to the memory circuit 108. The control circuit 110 may also generate and present an address signal (e.g., ADD) to the memory circuit 108. The received parity instruction 102 may be routed by the control circuit 110 to the error checking circuit 112 as a signal (e.g., PARITY). The memory circuit 108 may generate and present a data signal (e.g., DATA) to the error checking circuit 112. A parity or error signal (e.g., P) may also be generated by the memory circuit 108 and presented to the error checking circuit 112. The error checking circuit 112 may generate and present a signal (e.g., RSLT) to circuitry external to the CAM circuit 100 at an interface 118.

The control circuit 110 generally controls reading data from and writing data to the memory 108 through the signals CMD and ADD. The control circuit 110 may also be configured to detect and parse the parity instruction 102 from the instruction stream signal INSTR. Furthermore, the control circuit 110 may also parse an address, a number of memory locations to check, and a number of clock cycles to complete the error checking operation from the parity instruction 102.

The control circuit 110 may include a register 120 and a counter 122. The register 120 may be configured to store the address signal ADD. The counter circuit 122 may be configured to increment the address signal ADD. Incrementing may be in steps of a single address unit or multiple address units depending upon a relationship between a physical word size and a logical word size of the memory circuit 108.

The memory 108 generally comprises multiple memory locations 124a–n. Each memory location 124a–n may have an entry or data portion 126 and an error detection portion 128. Each data portion 126 may be physically arranged as a multiple-bit data word. For example, each data portion 126 may store a 72-bit or a 144-bit word. The data portions 126 may be read from the memory locations 124a–n and presented to the error checking circuit 112 in the signal DATA during error checking operations. The memory locations 124a–n may be linked to form larger logical word sizes, such as 288-bit and 576-bit words. Other physical and logical word sizes may be implemented to meet the design criteria of a particular application.

Each error detection portion 128 may be implemented as one or more error detection bits or as one or more error detection and correction bits. In one embodiment, the error detection portion 128 may hold a single parity bit for the entire associated data portion 126. In another embodiment, the error detection portion 128 may store nine parity bits, a parity bit for each byte in a 72-bit data portion 126. The error bits may be read from the memory locations 124a–n and presented to the error checking circuit 112 in the signal P in support of the error checking operations. Other implementations of the error detection portion 128 may be provided to meet the error detection and/or error correction requirements of a particular design.

The error checking circuit 112 may be configured to perform the error checking operations for one or more memory locations 124a–n to generate the result signal RSLT. In one embodiment, the error checking circuit 112 may be implemented as a parity checking engine with access to the error detection portions 128 holding parity information. The error checking engine 112 may initiate an error checking operation upon receipt of the parity instruction 102 from the control circuit 110.

The error checking operation is generally performed for a single memory location 124a–n as determined by the address signal ADD. Checking a single memory location 124a–n may be useful where each data item may be stored in a single memory location 124a–n. The address signal ADD may be defaulted to a predetermined starting address on power up, for example a lowest memory address. In response to the first parity instruction 102, the error checking circuit 112 may check for a soft error in the data item stored at the current address stored in the register 120. After the check and any possible error correction has been completed, the counter circuit 122 may increment the address signal ADD to a next address. Upon reaching a last address in the memory circuit 108, the counter circuit 122 may wrap the address value around to the beginning of the memory circuit 108. A result of the error checking operation may be presented by generating the result signal RSLT in a pass state or a fail state accordingly.

In another embodiment, the error checking operation may be performed on several memory locations simultaneously or in a rapid sequence starting from the address signal ADD. Checking multiple memory locations together may be useful where the data items may be wider than a single memory location 124a–n or just to reduce a number of individual parity checking operations. For example, a 144-bit data word may reside in two 72-bit memory locations 124a–n. Therefore, a parity check for the 144-bit data word may be performed for both 72-bit data words simultaneously or may involve a first parity check on the lower 72-bits and a second parity check on the upper 72-bits. The results of each parity check may be logically combined to produce the result signal RSLT. For simultaneous error checking operations, the counter circuit 122 may increment the address signal ADD by an integer number matching the number of memory locations 124a–n checked. For sequential multiple checks, the counter circuit 122 may increment the address by a single address unit for each memory location 124a–n in the group of memory locations being checked. By checking one or more memory locations 124a–n at a time, all of the memory locations 124a–n may be checked by a number of parity instructions 102 equal to or less than a total number of memory locations 124a–n.

The CAM circuit 100 may be designed to allow for random selection within the memory circuit 108 for the error checking operation. A particular address may be provided from the user device 104 with or as part of the parity instruction 102. For the particular address, the counter circuit 122 may skip incrementing the address value at the end of the error checking operation in anticipation of a new starting address arriving from external to the CAM circuit 100.

A number of memory locations 124*a–n* to be checked as a group may also be identified by the user device 104 and transferred to the CAM circuit 100 associated with or within the parity instruction 102. The number of memory locations 124*a–n* of the group may instruct the counter circuit 122 how many times to increment during the error checking operation. Returning to the example of the 144-bit data word stored in two of the memory locations 124*a–n*, the number of memory locations 124*a–n* in the group may have a value of two. Therefore, after the error checking operation has completed for the higher 72-bits, the counter 122 may increment the address signal ADD in support of an error checking operation on the lower 72-bits.

The signal CONFIG may be used to configure the CAM circuit 100 for legacy operations. For example, the signal CONFIG may have a first state where error checking operations performed by the CAM circuit 100 may operate conventionally. In the first state, the control circuit 110 may monitor the instruction stream signal INSTR for the idle instruction 106*a*. Upon detection of an idle instruction 106*a*, the error checking circuit 112 may perform the error checking operation on the memory location 124*a–n* pointed to by the current address signal ADD stored in the register 120. Thereafter, the counter circuit 122 may increment the address value.

While the signal CONFIG is in the first state, the control circuit 110 may monitor the instruction stream signal INSTR for the non-activity gap 107 or a lack of instructions. If no valid instructions have been received for a predetermined amount of time, the error checking circuit 112 may use the available CAM clock cycles to perform another error checking operation. Likewise, the error checking circuit 112 may initiate an error checking operation during "hidden" cycles available through a higher internal clock rate.

In one embodiment, initiation of the error checking operation may be triggered by the conventional idle instruction 106*a*, gaps 107 in the instruction stream, available hidden cycle time and/or the explicit parity instruction 102. In another embodiment, the signal CONFIG may be used to inhibit, disable or ignore error checking operations requested through a parity instruction 102. As such, the CAM circuit 100 may appear to the user device 104 as a purely conventional CAM device. While the signal CONFIG is in a second state, the CAM circuit 100 may ignore or disable the idle instructions 106*a*, gaps 107, and available hidden cycle times to start the error checking operation. Therefore, the CAM circuit 100 may be configured to perform the error checking operations only when commanded to do so by the parity instruction 102 provided from the user device 104. When the error checking operation may respond only to the parity instruction 102, core operations of the CAM circuit 100 may be synchronized with the number of received instructions since all core operations may be associated with a particular instruction.

Figure 4:
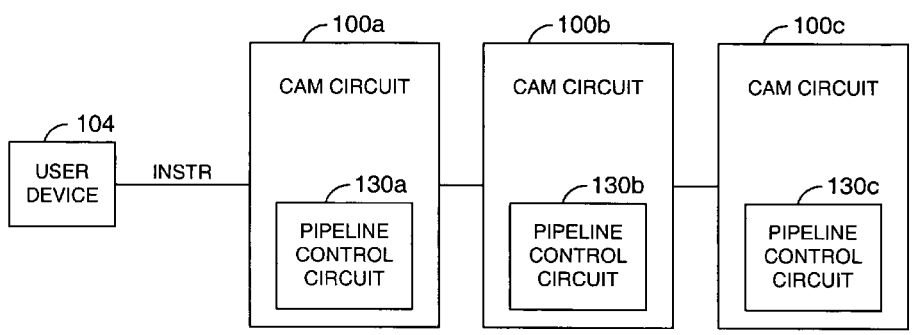
FIG. 4 is a block diagram of cascaded CAM circuits.

Referring to FIG. 4, a block diagram of cascaded CAM circuits 100 is shown. Multiple CAM circuits 100*a–c* may be coupled to provide increased storage (e.g., for large databases). Each CAM circuit 100*a–c* may include a pipeline control circuit 130*a–c* to facilitate the cascading. The pipeline control circuits 130*a–c* may make the CAM circuits 100*a–c* appear to the user device 104 as one larger CAM circuit having a wider memory range and/or more memory locations 124 available for storage. The pipeline control circuits 130*a–c* may also support the error checking operations through each CAM circuit 100*a–c* in response to receipt of the parity instruction 102 by the first CAM circuit 100*a*.

Figure 5:
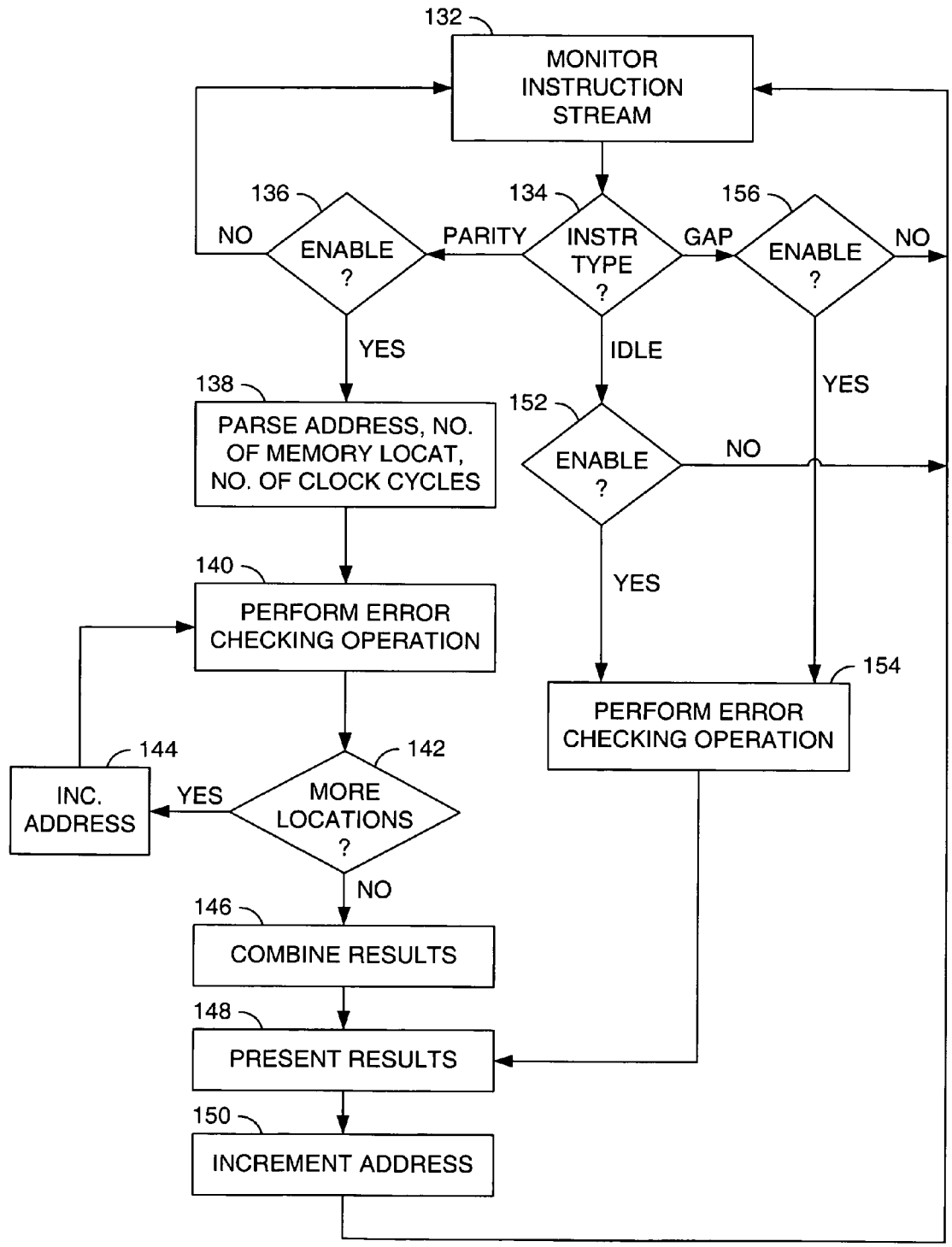
FIG. 5 is a flow diagram of a method of operating a CAM circuit.

Referring to FIG. 5, a flow diagram of a method of operating the CAM circuit 100 is shown. The CAM circuit 100 generally monitors the incoming instruction stream for the parity instruction 102, the idle instruction 106*a*, and gaps 107 (e.g., block 132). Upon detection of a parity instruction 102 (e.g., the PARITY branch of decision block 134), a check of the signal CONFIG may be made to determine if the parity instruction 102 should be accepted or not (e.g., decision block 136).

An accepted parity instruction 102 may be parsed to determine the starting address, the number of memory locations, and the number of clock cycles that may be associated with the parity instruction (e.g., block 138). The error checking operation may then be performed on the memory location 124*a–n* determined by the signal ADD (e.g., block 140). If additional memory locations 124*a–n* should be checked (e.g., the YES branch of decision block 142), the counter 122 may increment the signal ADD accordingly (e.g., block 144). The error checking operation may then be repeated with a subsequent memory location 124*a–n* (e.g., block 140).

After all designated memory locations 124*a–n* have been checked (e.g., the NO branch of decision block 142), the results of each check may be combined (e.g., block 146). The combined results may be presented in the signal RSLT (e.g., block 148). Optionally, the address signal ADD may be incremented (e.g., block 150). Finally, the CAM circuit 100 may return to monitoring the instruction stream (e.g., block 132).

Detection of an idle instruction 106*a* (e.g., the IDLE branch of decision block 134) may cause a check of the signal CONFIG (e.g., decision block 152). If the error checking operation has been enabled for the idle instruction 106*a* (e.g., the YES branch of decision block 152), the error checking operation may be performed using the address stored in the register 120 (e.g., block 154). A result of the error checking operation may be presented in the signal RSLT (e.g., block 148). The address may be incremented to the next memory location (e.g., block 150). Then the CAM circuit 100 may return to monitoring the instruction stream (e.g., block 132).

Detection of a gap 107 in the instruction stream (e.g., the GAP branch of decision block 134) or the availability of hidden cycles may cause a check of the signal CONFIG (e.g., decision block 156). If the error checking operation has been enabled during gaps or hidden cycles (e.g., the YES branch of decision block 156), the error checking operation may be performed using the address stored in the register 120 (e.g., block 154). A result of the error checking operation may be presented in the signal RSLT (e.g., block 148). The address may be incremented to the next memory location (e.g., block 150). The CAM circuit 100 may then return to monitoring the instruction stream (e.g., block 132).

The parity instruction 102 may provide several advantages to an interaction between the user device 104 and the CAM circuit 100. One advantage may be to insulate the user device 104 from variations in the number of conventional idle cycles 106*a* or latency for error checking operations in a particular CAM circuit implementation. The user device 104 may treat the parity instruction 102 similar to all other instructions 106*a–e* regardless of the particular CAM circuit design. Another advantage may be to provide the user device 104 control of exactly when an error check operation occurs in the CAM circuit 100. Error checking operations due to idle instructions 106a, gaps 107, or hidden cycles may be inhibited while explicitly initiated by the user device 104 with the parity instruction 102. Still another advantage may be control of the frequency of error check operations by the user device 104 so that a level of parity robustness may be directly correlated by the user device 104.

As used herein, the term "simultaneously" is meant to describe events that share some common time period but the term is not meant to be limited to events that begin at the same point in time, end at the same point in time, or have the same duration. The various signals of the present invention may be implemented as single-bit or multi-bit signals in a serial and/or parallel configuration.

While the invention has been particularly shown and described with reference to the preferred embodiments thereof, it will be understood by those skilled in the art that various changes in form and details may be made without departing from the spirit and scope of the invention.

What is claimed is:

1. A method of operating a circuit, comprising the steps of:
    (A) receiving an explicit error checking instruction generated outside said circuit;
    (B) performing an error checking operation for at least one of a plurality of memory locations within said circuit;
    (C) generating a result signal from said error checking operation; and
    (D) completing said error checking operation within a predetermined number of clock cycles.

2. The method according to claim 1, wherein said step (B) comprises the sub-step of performing said error checking operation on at least two of said memory locations for each said explicit error checking instruction received.

3. The method according to claim 2, wherein said explicit error checking instruction indicates said at least two memory locations.

4. The method according to claim 1, wherein said step (B) further comprises the sub-step of performing said error checking operation at a starting address generated outside said circuit.

5. The method according to claim 4, wherein said explicit error checking instruction comprises said starting address.

6. The method according to claim 4, further comprising the step of incrementing said starting address by a plurality of address units.

7. The method according to claim 1, wherein said explicit error checking instruction indicates said predetermined number of clock cycles.

8. The method according to claim 1, further comprising the step of performing said error checking operation in response to an idle instruction received while a configuration signal is in a first state.

9. The method according to claim 1, further comprising the step of performing said error checking operation in response to not receiving a valid instruction for a predetermined amount of time while a configuration signal is in a first state.

10. The method according to claim 1, further comprising the step of disabling said explicit error checking instruction in response to a configuration signal having a first state.

11. A circuit comprising:
    a plurality of memory locations;
    a checking circuit configured to (i) perform an error checking operation for at least one of said memory locations in response to receiving an explicit error checking instruction generated outside said circuit and (ii) generate a result signal from said error checking operation; and
    a register coupled to said memory locations and configured to store an address generated outside said circuit.

12. The circuit according to claim 11, further comprising a counter configured to increment said address by a plurality of address units.

13. The circuit according to claim 11, further comprising a control circuit configured to detect said explicit error checking instruction from a stream of instructions.

14. The circuit according to claim 11, wherein each of said memory locations comprises an error detection portion accessible to said error checking operation.

15. The circuit according to claim 11, wherein said memory locations are configured as a first content addressable memory circuit.

16. The circuit according to claim 15, further comprising a second content addressable memory circuit cascaded with said first content addressable memory circuit and responsive to said explicit error checking instruction received by said first content addressable memory circuit.

17. The circuit according to claim 11, wherein said checking circuit is further configured to perform said error checking operation on all said memory locations in response to receiving a predetermined number of said explicit error checking instructions.

18. A method of operating a circuit, comprising the steps of:
    (A) receiving an explicit error checking instruction generated outside said circuit;
    (B) performing an error checking operation for at least one of a plurality of memory locations within said circuit;
    (C) generating a result signal from said error checking operation; and
    (D) disabling said explicit error checking instruction in response to a configuration signal having a first state.

* * * * *